United States Patent
Ko et al.

(10) Patent No.: US 8,004,073 B2
(45) Date of Patent: Aug. 23, 2011

(54) INTEGRATED CIRCUIT PACKAGING SYSTEM WITH INTERPOSER AND METHOD OF MANUFACTURE THEREOF

(75) Inventors: Chan Hoon Ko, Ichon si (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 67 days.

(21) Appl. No.: 12/486,568

(22) Filed: Jun. 17, 2009

(65) Prior Publication Data

US 2010/0320619 A1    Dec. 23, 2010

(51) Int. Cl.
*H01L 23/02* (2006.01)
*H01L 21/20* (2006.01)

(52) U.S. Cl. ........... 257/678; 438/393; 257/E21.597; 257/E23.011

(58) Field of Classification Search .......... 257/532, 257/737, 678, E21.502, E21.597, E23.01, 257/E23.011; 438/127, 393, 597
See application file for complete search history.

(56) References Cited

U.S. PATENT DOCUMENTS

| | | | |
|---|---|---|---|
| 5,530,288 A | 6/1996 | Stone | |
| 6,274,937 B1 | 8/2001 | Ahn et al. | |
| 7,032,392 B2 * | 4/2006 | Koeneman et al. | ... 257/E21.511 |
| 7,151,009 B2 | 12/2006 | Kim et al. | |
| 7,531,905 B2 | 5/2009 | Ishino et al. | |
| 2010/0244221 A1 * | 9/2010 | Ko et al. | ........... 257/688 |
| 2011/0074492 A1 * | 3/2011 | Tran et al. | ........... 257/532 |

* cited by examiner

*Primary Examiner* — Walter L Lindsay, Jr.
(74) *Attorney, Agent, or Firm* — Mikio Ishimaru

(57) ABSTRACT

A method of manufacture of an integrated circuit packaging system includes: attaching a lower integrated circuit, having a first through via, over a substrate with the first through via coupled to the substrate; mounting a pre-formed interposer, having an interposer through via and an integrated passive device, over the lower integrated circuit with the interposer through via coupled to the first through via; attaching an upper integrated circuit, having a second through via, over the pre-formed interposer; and forming an encapsulation over the upper integrated circuit and the pre-formed interposer.

18 Claims, 3 Drawing Sheets

INTEGRATED CIRCUIT PACKAGING SYSTEM WITH INTERPOSER AND METHOD OF MANUFACTURE THEREOF

TECHNICAL FIELD

The present invention relates generally to an integrated circuit packaging system, and more particularly to an integrated circuit packaging system with an interposer.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is a response to continually increasing demands on information and communication products for ever-reduced sizes, thicknesses, and costs along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made small and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). Conventional packages combined with the trend towards miniaturization create challenges for low cost, flexible, and reliable manufacturing.

Thus, a need still remains for an integrated circuit packaging system providing high connectivity, low cost manufacturing, and reduced size. In view of the ever-increasing need to save costs and improve efficiencies, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: attaching a lower integrated circuit, having a first through via, over a substrate with the first through via coupled to the substrate; mounting a pre-formed interposer, having an interposer through via and an integrated passive device, over the lower integrated circuit with the interposer through via coupled to the first through via; attaching an upper integrated circuit, having a second through via, over the pre-formed interposer; and forming an encapsulation over the upper integrated circuit and the pre-formed interposer.

The present invention provides an integrated circuit packaging system, including: a substrate; a lower integrated circuit, having a first through via, over the substrate with the first through via coupled to the substrate; a pre-formed interposer, having an interposer through via and an integrated passive device, over the lower integrated circuit with the interposer through via coupled to the first through via; an upper integrated circuit, having a second through via, over the pre-formed interposer; and an encapsulation over the upper integrated circuit and the pre-formed interposer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
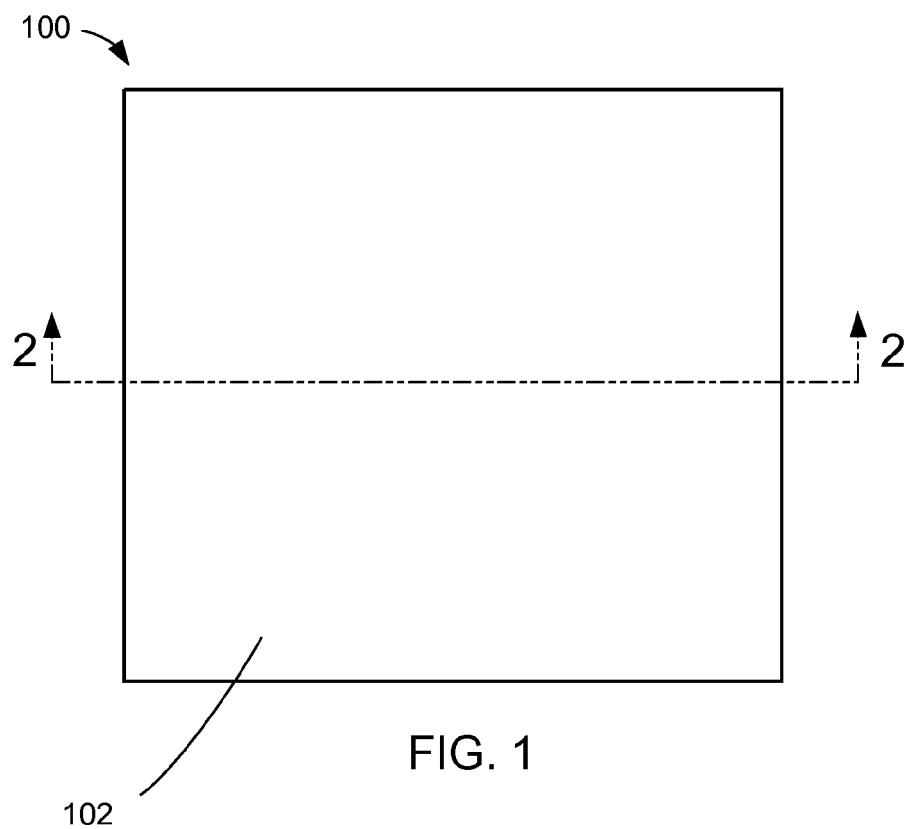
FIG. 1 is a top-view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

The term "providing" as used herein includes supplying or furnishing material. The term "attaching" as used herein includes fastening, affixing, and adhering. The term "forming" as used herein includes constructing, shaping and molding.

Referring now to FIG. 1, therein is shown a top-view of an integrated circuit packaging system 100 in a first embodiment of the present invention. The top view depicts an encapsulation 102, such as cover including an epoxy molding compound.

For illustrative purposes, the integrated circuit packaging system 100 is shown having a square configuration, although it is understood that the integrated circuit packaging system 100 can be formed in a different configuration. For example, the integrated circuit packaging system 100 can be formed in a rectangular configuration or have the corners in non-perpendicular intersection with the sides.

Figure 2:
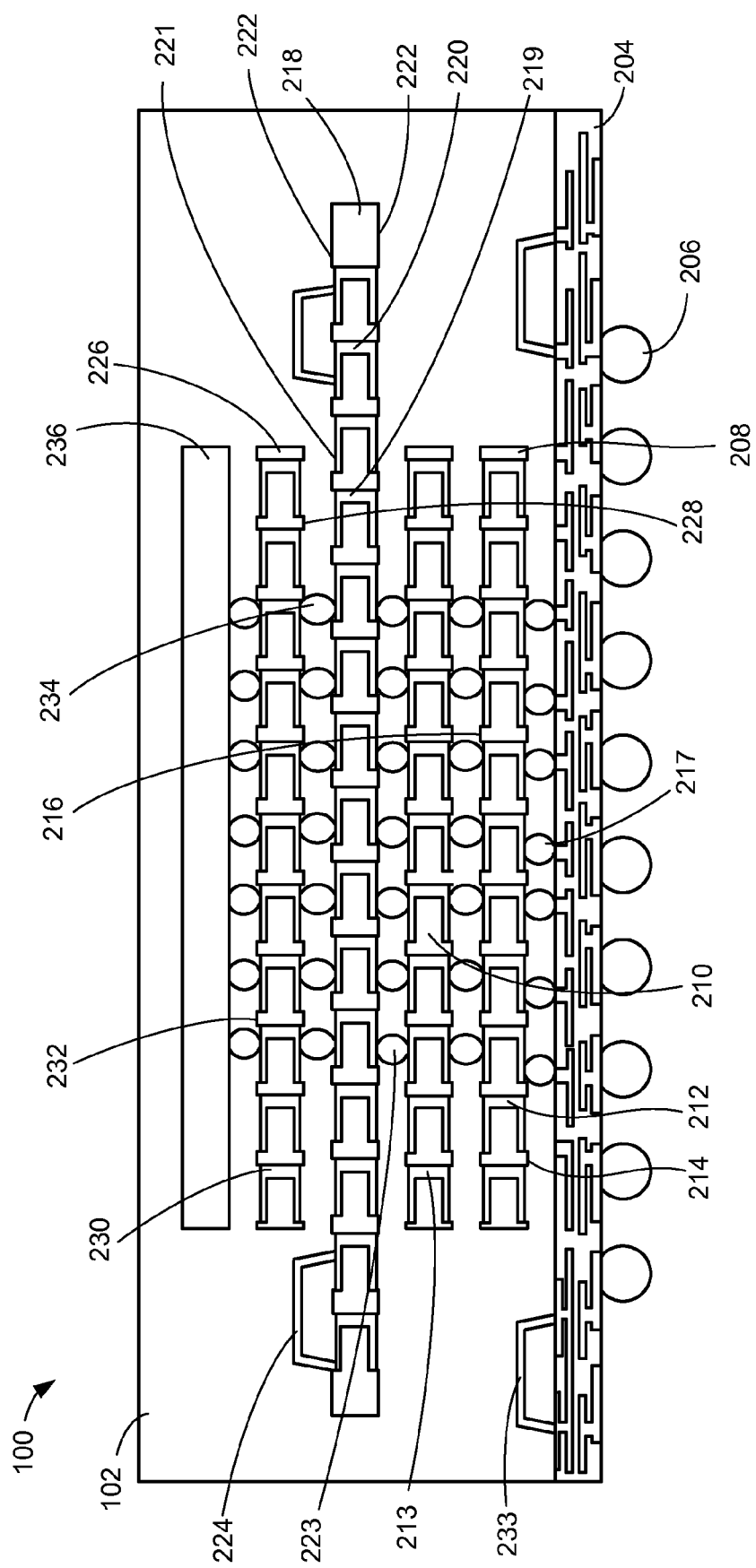
FIG. 2 is a cross-sectional view of the integrated circuit packaging system along line 2-2 of FIG. 1.

Referring now to FIG. 2, therein is shown is a cross-sectional view of the integrated circuit packaging system 100 along line 2-2 of FIG. 1. The cross-sectional view depicts a substrate 204, such as a printed circuit board or a laminated substrate. The substrate 204 can have an external interconnect 206, such as solder balls or conductive posts.

A first lower integrated circuit 208, such as an integrated circuit die or flip chip, can be attached to the substrate 204. A second lower integrated circuit 210 can be mounted above the first lower integrated circuit 208. A first through via 212 can traverse through the first lower integrated circuit 208. A second through via 213 can traverse through the second lower integrated circuit 210.

As an example, the first lower integrated circuit 208 and the second lower integrated circuit 210 are shown as the same type. It is understood that the first lower integrated circuit 208 and the second lower integrated circuit 210 can be different from each other. For example, the first lower integrated circuit 208 and the second lower integrated circuit 210 can be formed with different technologies, different sizes, and different functionalities.

A lower integrated circuit active side 214, having active circuitry thereon, of the first lower integrated circuit 208 can face the substrate 204. The first lower integrated circuit 208 can include a lower integrated circuit passive side 216 that can face away from the substrate 204. The first lower integrated circuit 208 can include a first device interconnect 217, such as a solder bumps, conductive bump or a conductive post, between the lower integrated circuit active side 214 and the substrate 204. As a more specific example, the first device interconnect 217 can be between the first through via 212 and the substrate 204.

The first device interconnect 217 can be between the first lower integrated circuit 208 and the second lower integrated circuit 210. As a more specific example, the first device interconnect 217 can connect the first through via 212 and the second through via 213.

A pre-formed interposer 218, such as a laminated interposer, a printed circuit board, a silicon interposer, a semiconductor interposer, or an integrated circuit die, can be pre-formed before being mounted over the second lower integrated circuit 210. The pre-formed interposer 218 can be pre-formed with an interposer through via 219, an integrated passive device 220, such as a resistor, capacitor, or inductor that can be used to form filtering circuits or programmable circuit paths. The interposer through via 219 can have contact pads 221, such as contacts or bond pads, and are preferably not planar with interposer horizontal sides 222.

For illustrative purposes, the integrated circuit packaging system 100 is shown with the integrated passive device 220 having the same or similar cross-sectional view as the interposer through via 219, although it is understood that the integrated circuit packaging system 100 can have a different configuration. For example, the pre-formed interposer 218 can have different structures that are not similar or the same between the integrated passive device 220 and the interposer through via 219.

Further for illustrative purposes, the integrated circuit packaging system 100 is shown with the contact pads 221 non-planar with the interposer horizontal sides 222, although it is understood that the integrated circuit packaging system 100 can have a different configuration. For example, the contact pads 221 can be planar with or extend from the interposer horizontal sides 222

The pre-formed interposer 218 can pre-formed with a pre-attached interconnect 223, such as a solder bump or other pre-attached conductive protrusion. The pre-formed interposer 218 can be pre-formed with first electrical interconnects 224, such as bond wires, ribbon bond wires, or conductive clips.

The first electrical interconnects 224 can connect between the interposer through via 219 and another of the interposer through via 219 for re-fusing or re-routing or re-switching functions with the pre-formed interposer 218. The first electrical interconnects 224 can connect the integrated passive device 220 to form filtering circuits.

It has been discovered that the present invention provides the integrated circuit packaging system having a pre-formed interposer provides a reliable connection structure. The inclusion of the integrated passive devices in the pre-formed interposer increases reliability of the integrated circuit packaging system by eliminating separate manufacturing steps to mount passive components to the pre-formed interposer. This structure also eliminates reliability issues arising from the encapsulating process that can separate discrete passive components from the pre-formed interposer.

It has been also discovered that the present invention provides the integrated circuit packaging system having a pre-formed interposer provides a flexible connection structure that can be modified before final assembly resulting in improved performance. The first electrical interconnects can be used to re-route, re-fuse, or re-switch the pre-formed interposer with the integrated passive device to form filtering circuits, such as noise cancellation filters for high frequency noise or inductor, resistor, capacitor (LRC) circuits. This improves the electrical performance of the integrated circuit packaging system. The first electrical interconnects can also be used to re-route, re-fuse, or re-switch signal, power, or ground paths through the pre-formed interposer to the rest of the integrated circuit packaging system.

A first upper integrated circuit 226 can be attached over the pre-formed interposer 218. An upper integrated circuit active side 228, having active circuitry thereon, can face the pre-formed interposer 218. A third through via 230 can traverse through the first upper integrated circuit 226.

The first upper integrated circuit 226 also includes an upper integrated circuit passive side 232 that faces away from the pre-formed interposer 218. The first upper integrated circuit 226 can be attached to the pre-formed interposer 218 by a second device interconnect 234, such as a solder bump or conductive post.

A second upper integrated circuit 236 can be mounted over the first upper integrated circuit 226. The second device interconnect 234 can also be between the second upper integrated circuit 236 and the first upper integrated circuit 226.

As an example, the first upper integrated circuit 226 and the second upper integrated circuit 236 are shown as different types. It is understood that the first upper integrated circuit 226 and the second upper integrated circuit 236 can be similar or the same to each other. For example, the first upper integrated circuit 226 and the second upper integrated circuit 236 can be formed with similar or the same technologies, sizes, and functionalities.

A second electrical interconnect 233, such as a bond wire, ribbon bond wire, or a conductive clip, can connect different conduction portions of the substrate 204 for re-routing, re-fusing, or re-switching the substrate 204. The encapsulation 102 can be over the substrate 204 covering the first lower integrated circuit 208, the second lower integrated circuit 210, the pre-formed interposer 218, the first upper integrated circuit 226 and the second upper integrated circuit 236.

Figure 3:
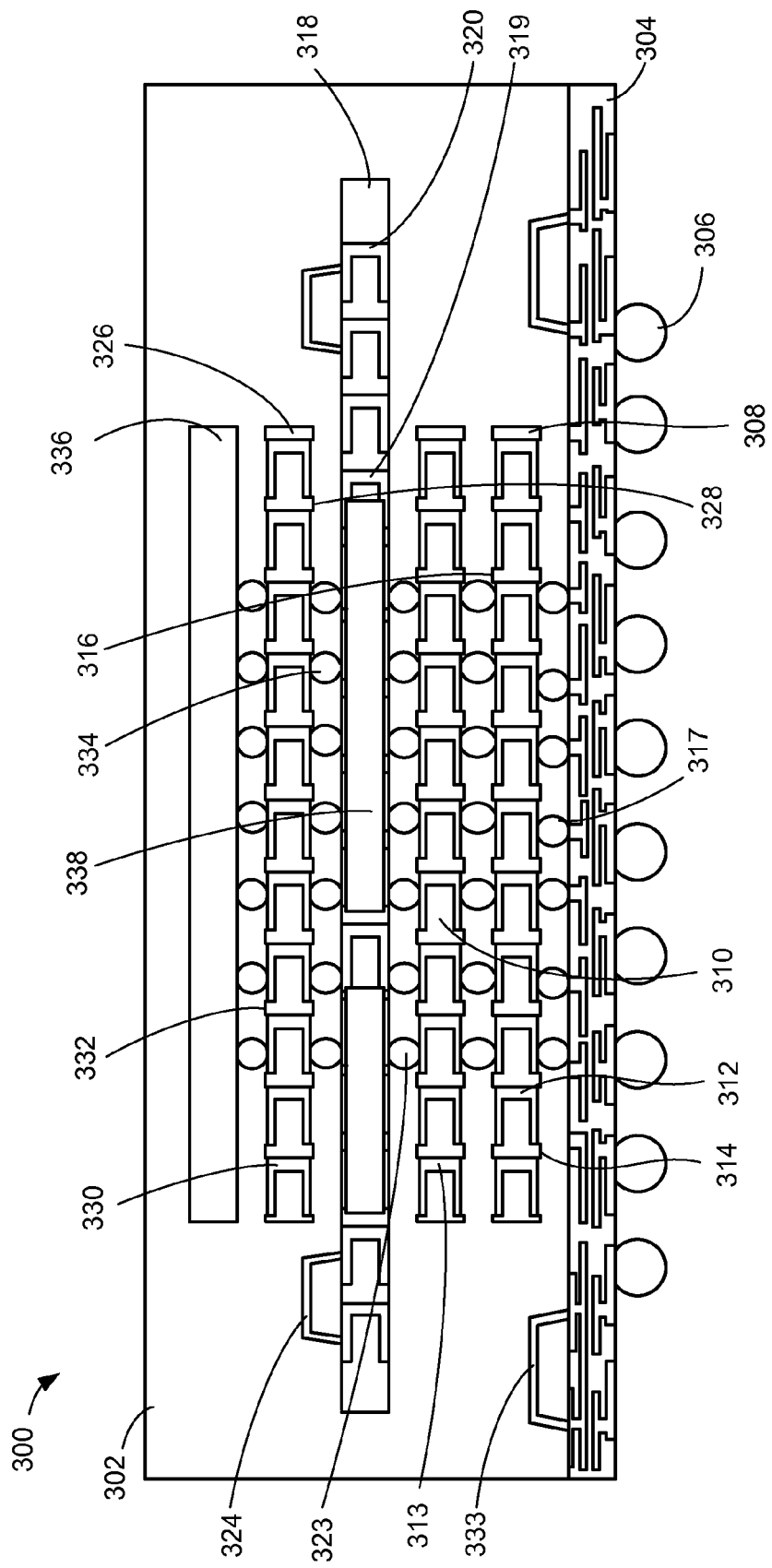
FIG. 3 is a cross-sectional view similar to FIG. 2 of an integrated circuit packaging system in a second embodiment of the present invention.

Referring now to FIG. 3, therein is shown is a cross-sectional view similar to FIG. 2 of an integrated circuit packaging system 300 in a second embodiment of the present invention. The cross-sectional view depicts a substrate 304, such as a printed circuit board or a laminated substrate. The substrate 304 can have an external interconnect 306, such as solder balls or conductive posts.

A first lower integrated circuit 308, such as an integrated circuit die or flip chip, can be attached to the substrate 304. A second lower integrated circuit 310 can be mounted above the first lower integrated circuit 308. A first through via 312 can traverse through the first lower integrated circuit 308. A second through via 313 can traverse through the second lower integrated circuit 310.

As an example, the first lower integrated circuit 308 and the second lower integrated circuit 310 are shown as the same type. It is understood that the first lower integrated circuit 308 and the second lower integrated circuit 310 can be different from each other. For example, the first lower integrated circuit 308 and the second lower integrated circuit 310 can be formed with different technologies, different sizes, and different functionalities.

A lower integrated circuit active side 314, having active circuitry thereon, of the first lower integrated circuit 308 can face the substrate 304. The first lower integrated circuit 308 can include a lower integrated circuit passive side 316 that can face away from the substrate 304. The first lower integrated circuit 308 can include a first device interconnect 317, such as a solder bumps, conductive bump or a conductive post, between the lower integrated circuit active side 314 and the substrate 304. As a more specific example, the first device interconnect 317 can be between the first through via 312 and the substrate 304.

The first device interconnect 317 can be between the first lower integrated circuit 308 and the second lower integrated circuit 310. As a more specific example, the first device interconnect 317 can connect the first through via 312 from the first lower integrated circuit 308 and the second lower integrated circuit 310.

A pre-formed interposer 318, such as a laminated interposer or a printed circuit board, can be pre-formed before being mounted over the first lower integrated circuit 308 and the second lower integrated circuit 310. An embedded integrated circuit 338 can be pre-formed within the pre-formed interposer 318. The pre-formed interposer 318 can be pre-formed with an interposer through via 319, an integrated passive device 320, such as a resistor, capacitor, inductor, to form filtering circuits or programmable circuit paths.

For illustrative purposes, the integrated circuit packaging system 300 is shown with the integrated passive device 320 having the same or similar cross-sectional view as the interposer through via 319, although it is understood that the integrated circuit packaging system 300 can have a different configuration. For example, the pre-formed interposer 318 can have different structures that are not similar or the same between the integrated passive device 320 and the interposer through via 319.

The pre-formed interposer 318 can pre-formed with a pre-attached interconnect 322, such as a solder bump or other pre-attached conductive protrusion. The pre-formed interposer 318 can be pre-formed with first electrical interconnects 324, such as bond wires, ribbon bond wires, or conductive clips.

The first electrical interconnects 324 can connect the interposer through via 319 to another of the interposer through via 319 for re-fusing or re-routing or re-switching functions with the pre-formed interposer 318. The first electrical interconnects 324 can connect different types of the integrated passive device 320, such as resistors, capacitors, or inductors, to form filtering circuits. The first electrical interconnects 324 can be connected to re-route or re-switch connections to the embedded integrated circuit 338.

It has been further discovered that the present invention provides the integrated circuit packaging system having a pre-formed interposer provides a reliable connection structure. The inclusion of the embedded integrated circuits in the pre-formed interposer increases reliability of the integrated circuit packaging system by eliminating separate manufacturing steps to mount additional integrated circuits to the pre-formed interposer.

It has been yet further discovered that the present invention provides the integrated circuit packaging system having the pre-formed interposer providing a compact footprint from dual connectivity and increased re-routing, re-fusing, or re-switching capabilities. The pre-formed interposer with the interposer though via along with the pre-attached interconnects provide dual connectivity from above and below the integrated packaging system. The first through via and the interposer through via enable the embedded integrated circuit to be electrically coupled to the rest of the integrated circuit packaging system both above and below the pre-formed interposer. The first electrical interconnects allows re-routing, re-fusing, or re-switching of the pre-formed interposer to and from the embedded integrated circuit and the rest of the integrated circuit packaging system. The first electrical interconnects also provides re-addressing capabilities.

A first upper integrated circuit 326 can be attached over the pre-formed interposer 318. An upper integrated circuit active side 328, having active circuitry thereon, can face the pre-formed interposer 318. A third through via can traverse through the first upper integrated circuit 326.

The first upper integrated circuit 326 also includes an upper integrated circuit passive side 332 faces away from the pre-formed interposer 318. The first upper integrated circuit 326 can be attached to the pre-formed interposer 318 by a second device interconnect 334, such as a solder bump or conductive post.

A second upper integrated circuit 336 can be mounted above the first upper integrated circuit 326. The second device interconnect 334 can also be between the second upper integrated circuit 336 and the upper integrated circuit.

Second electrical interconnect 333, such as a bond wire, ribbon bond wire, or a conductive clip, can connect different conduction portions of the substrate 304 for re-routing, re-fusing, or re-switching the substrate 304. An encapsulation 302 can be over the substrate 304 covering the lower integrated circuit 310, the pre-formed interposer 318, and the first upper integrated circuit 326.

Figure 4:
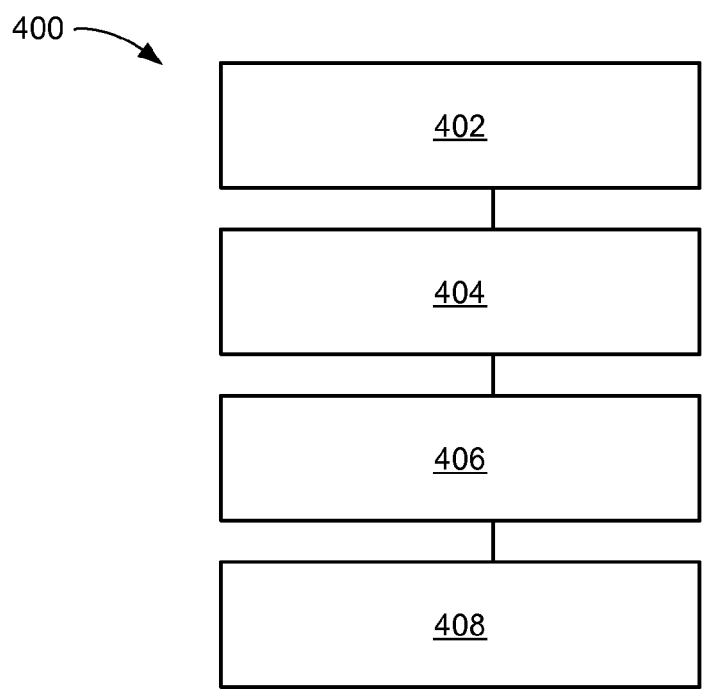
FIG. 4 is a flow chart of a method of manufacture of an integrated circuit packaging system in a further embodiment of the present invention.

Referring now to FIG. 4, therein is shown a flow chart of a method 400 of manufacture of an integrated circuit packaging system in a further embodiment of the present invention. The method 400 includes: attaching a lower integrated circuit, having a first through via, over a substrate with the first through via coupled to the substrate in a block 402; mounting a pre-formed interposer, having an interposer through via and an integrated passive device, over the lower integrated circuit with the interposer through via coupled to the first through via in a block 404; attaching an upper integrated circuit, having a second through via, over the pre-formed interposer in a block 406; and forming an encapsulation over the upper integrated circuit and the pre-formed interposer in a block 408.

The resulting method and product is straightforward, cost-effective, uncomplicated, highly versatile and effective, can be surprisingly and unobviously implemented by adapting known technologies, and are thus readily suited for efficiently and economically manufacturing integrated circuit packaging systems.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    attaching a lower integrated circuit, having a first through via, over a substrate with the first through via coupled to the substrate;
    mounting a pre-formed interposer, having an interposer through via and an integrated passive device, over the lower integrated circuit with the interposer through via coupled to the first through via;
    connecting a first electrical interconnect between different types of integrated passive devices to form filtering circuits to form filtering circuits, attaching an upper integrated circuit, having a second through via, over the pre-formed interposer; and
    forming an encapsulation over the upper integrated circuit and the pre-formed interposer.

2. The method as claimed in claim 1 further comprising connecting a first electrical interconnect between the integrated passive device and the interposer through via.

3. The method as claimed in claim 1 wherein mounting the pre- formed interposer over the lower integrated circuit includes mounting an embedded integrated circuit over the lower integrated circuit with the embedded integrated circuit within the pre-formed interposer.

4. The method as claimed in claim 1 further comprising connecting a second electrical interconnect between different portions of the substrate.

5. A method of manufacture of an integrated circuit packaging system comprising:
    attaching a lower integrated circuit, having a first through via, over a substrate with the first through via coupled to the substrate;
    mounting a pre-formed interposer, having an interposer through via, an integrated passive device, and a first electrical interconnect, over the lower integrated circuit with the interposer through via coupled to the first through via and the first electrical interconnect connected to the integrated passive device;
    attaching an upper integrated circuit, having a second through via, over the pre- formed interposer, includes attaching a flip chip;
    forming an encapsulation over the upper integrated circuit and the pre-formed interposer; and
    attaching an external interconnect under the substrate.

6. The method as claimed in claim 5 wherein attaching the upper integrated circuit, having the second through via, over the pre-formed interposer includes connecting the second through via and the interposer through via.

7. The method as claimed in claim 5 wherein mounting the pre- formed interposer over the lower integrated circuit includes:
    mounting a silicon interposer.

8. The method as claimed in claim 5 wherein:
    mounting the pre-formed interposer over the lower integrated circuit includes:
        mounting an embedded integrated circuit over the lower integrated circuit with the embedded integrated circuit within the pre-formed interposer; and
    attaching the upper integrated circuit, having the second through via, over the pre- formed interposer includes:
        mounting the upper integrated circuit over the embedded integrated circuit.

9. An integrated circuit packaging system comprising:
    a substrate;
    a lower integrated circuit, having a first through via, over the substrate with the first through via coupled to the substrate;
    a pre-formed interposer, having an interposer through via and an integrated passive device, over the lower integrated circuit with the interposer through via coupled to the first through via;
    an upper integrated circuit, having a second through via, over the pre-formed interposer; and
    an encapsulation over the upper integrated circuit and the pre-formed interposer.

10. The system as claimed in claim 9 further comprising a first electrical interconnect between the integrated passive device and the interposer through via.

11. The system as claimed in claim 9 wherein the pre-formed interposer includes an embedded integrated circuit over the lower integrated circuit.

12. The system as claimed in claim 9 further comprising a first electrical interconnect between different types of the integrated passive devices to form filtering circuits.

13. The system as claimed in claim 9 further comprising a second electrical interconnect between different portions of the substrate.

14. The system as claimed in claim 9 wherein:
    the pre-formed interposer includes a first electrical interconnect connected to the integrated passive device; and
    further comprising:
    an external interconnect under the substrate.

15. The system as claimed in claim 14 wherein the upper integrated circuit having the second through via includes the second through via connected to the interposer through via.

16. The system as claimed in claim 14 wherein the pre-formed interposer includes a silicon interposer.

17. The system as claimed in claim 14 wherein:
    the pre-formed interposer includes:
    an embedded integrated circuit over the lower integrated circuit; and
    the upper integrated circuit, having the second through via, over the pre-formed interposer includes:
    the upper integrated circuit over the embedded integrated circuit.

18. The system as claimed in claim 14 wherein the upper integrated circuit includes a flip chip.

* * * * *